(12) United States Patent
Nguyen

(10) Patent No.: US 6,300,816 B1
(45) Date of Patent: Oct. 9, 2001

(54) FEEDFORWARD-CONTROLLED SENSE AMPLIFIER

(75) Inventor: Huy Nguyen, Fremont, CA (US)

(73) Assignee: Rosun Technologies, Inc., Fremont, CA (US)

( * ) Notice: Subject to any disclaimer, the term of this patent is extended or adjusted under 35 U.S.C. 154(b) by 0 days.

(21) Appl. No.: 09/696,703

(22) Filed: Oct. 24, 2000

(51) Int. Cl.[7] .......................... H03K 17/62; H03K 17/76; H03K 17/693; H03K 17/735

(52) U.S. Cl. .............................. 327/407; 327/403; 327/30; 327/99; 327/51; 327/205; 365/189.08; 365/190

(58) Field of Search .................. 327/407, 99, 50–52, 327/55, 57, 63–65, 205, 560–563, 403, 28–30; 365/190, 189.08, 205, 207; 326/105

(56) References Cited

U.S. PATENT DOCUMENTS

| | | | |
|---|---|---|---|
| 5,155,397 | * 10/1992 | Fassino et al. | 327/55 |
| 5,157,291 | * 10/1992 | Shimoda | 327/407 |
| 5,889,419 | * 3/1999 | Fischer et al. | 327/403 |
| 6,091,277 | * 7/2000 | Fujii | 327/407 |
| 6,215,339 | * 4/2001 | Hedberg | 327/108 |

* cited by examiner

Primary Examiner—Terry D. Cunningham
Assistant Examiner—Long Nguyen
(74) Attorney, Agent, or Firm—Carr & Ferrell, LLP; Morgan E. Malino

(57) ABSTRACT

A circuit for discriminating between complementary first and second input signals. By using a logic gate in parallel with a signal amplifying circuit, the signal amplifying circuit can be disabled when it is no longer required. Once the logic gate is capable of detecting distinct complementary states in the two input signals, the signal amplifying circuit is disabled and the circuit uses one of the input signals as its output signal. The circuit is improved by using a pair of Schmitt inverters so the logic circuit will not vacillate unpredictably when the input signals are in an indeterminate state.

7 Claims, 7 Drawing Sheets

US 6,300,816 B1

FEEDFORWARD-CONTROLLED SENSE AMPLIFIER

BACKGROUND OF THE INVENTION

1. Field of the Invention

The present invention relates generally to the design of integrated circuits and more particularly to sense amplifiers.

2. Description of the Background Art

Many systems on an integrated circuit are designed to respond differently depending upon whether their input voltages are considered HIGH or LOW. Sometimes, an input voltage must be modified to conform to the HIGH or LOW state (e.g., during the period when the input voltage transitions between states). Sense amplifiers are circuits that detect a small voltage differential and increase or decrease the voltage to a level required by the system. An example of a system that utilizes sense amplifiers is a computer memory circuit. Information stored in the memory cells of a memory chip using sense amplifiers can be retrieved much faster than from a memory chip without sense amplifiers.

As shown in FIG. 1, a common static random access memory (SRAM) configuration generally designated 100 includes an array 105 of memory cells 110. Each memory cell 110 is connected to a word line 115, a bit line B 120, and a complement of the bit line, $\overline{B}$ 145. The memory cells 110 connected to each of the word lines 115 define a memory cell array row 125, and the memory cells connected to each of the bit line B 120 and a corresponding complement of the bit line $\overline{B}$ 145 define a memory cell array column 130. Each memory cell 110 stores information in the form of a voltage charge representing a logic value of LOW or HIGH. A voltage level equal to $V_{DD}$ represents the logic value of HIGH and $V_{SS}$ represents the logic value of LOW.

Bit lines B 120 and $\overline{B}$ 145 are connected to an equalization and precharge circuit 150. The precharge component of the equalization and precharge circuit 150 initially charges bit lines B 120 and $\overline{B}$ 145 to the voltage level of $V_{DD}$. The equalization component of the equalization and precharge circuit 150 ensures that the voltages on bit lines B 120, $v_B$, and $\overline{B}$ 145, $v_{\overline{B}}$, are initially at the same level.

The word lines 115 are connected to a row decoder 155. When a memory cell 110' is accessed, the row decoder 155 selects and changes the voltage of a word line 115' corresponding to memory cell 110'. A changed voltage signal (e.g., LOW to HIGH) from the word line 115' allows memory cell 110' to communicate with bits lines B 120' and $\overline{B}$ 145'. If memory cell 110' stores a logic value of HIGH, then $v_{\overline{B}}$ will remain at HIGH and $v_B$ will decrease to LOW. If memory cell 110' stores a logic value of LOW, then $v_B$ will decrease to LOW and $v_{\overline{B}}$ will remain at HIGH.

Bit lines B 120 and $\overline{B}$ 145 are connected to a sense amplifier 160 which detects and amplifies the difference in voltage between $v_B$ and $v_{\overline{B}}$. Depending on the difference between $v_B$ and $v_{\overline{B}}$, the sense amplifier 160 will output either $V_{DD}$ or $V_{SS}$.

Connected to the sense amplifier 160 is a column decoder 165. The column decoder 165, like the row decoder 155, includes a combination of logic circuits that select a logic signal from either one or a set of the memory cell array columns 130 for final output from SRAM 100.

The prior art described above suffers from a number of limitations. To store more information on a single memory chip, smaller memory cells are used. Smaller memory cells, however, use smaller transistors, which have less driving capability, resulting in a longer time for $v_B$ and $v_{\overline{B}}$ to reach distinct HIGH or LOW voltage levels. To reduce the time required to read a memory cell, sense amplifiers are used to quickly detect the small voltage difference between $v_B$ and $v_{\overline{B}}$ without having to wait for $v_B$ and $v_{\overline{B}}$ to reach definite HIGH or LOW voltage levels. However, when $v_B$ and $v_{\overline{B}}$ reach definite HIGH or LOW voltage levels before the operation of the sense amplifier, the operation of the sense amplifier is not required and consumes unnecessary power.

What is needed is a sense amplifier design that overcomes the shortfalls of the sense amplifier designs known in the art.

SUMMARY OF THE INVENTION

The invention provides a circuit for discriminating between the states of complementary first and second input signals. The input signals are either in distinctly complementary states, in indeterminate states, or in distinctly non-complementary states. The circuit includes a logic gate circuit, a signal amplifying circuit and an input select circuit.

The logic gate circuit determines whether the complementary input signals are in distinctly complementary states. The logic gate circuit produces a first output when the input signals are in distinctly non-complementary states and a second output when the input signals are in distinctly complementary states. In one embodiment of the invention, a pair of Schmitt triggers ensure that the logic gate's output does not change when the input signals are in indeterminate states.

The signal amplifying circuit output varies depending upon whether the first input signal is greater than, equal to, or less than the second input signal. To conserve power, the signal amplifying circuit is enabled in response to the first output of the logic gate circuit and disabled in response to the second output of the logic gate circuit. Thus, the signal amplifying circuit is disabled when signal amplification is no longer needed in the case where the first and second input signals are distinctly complementary.

The input select circuit output provides the output for the circuit. The input select circuit output is dependant upon the signal amplifying circuit output when the signal amplifying circuit is enabled and either the first input signal or the second input signal when the signal amplifying circuit is disabled.

Other advantages and features of the present invention will be apparent from the drawings and detailed description as set forth below.

DETAILED DESCRIPTION OF THE PREFERRED EMBODIMENT

Figure 1:
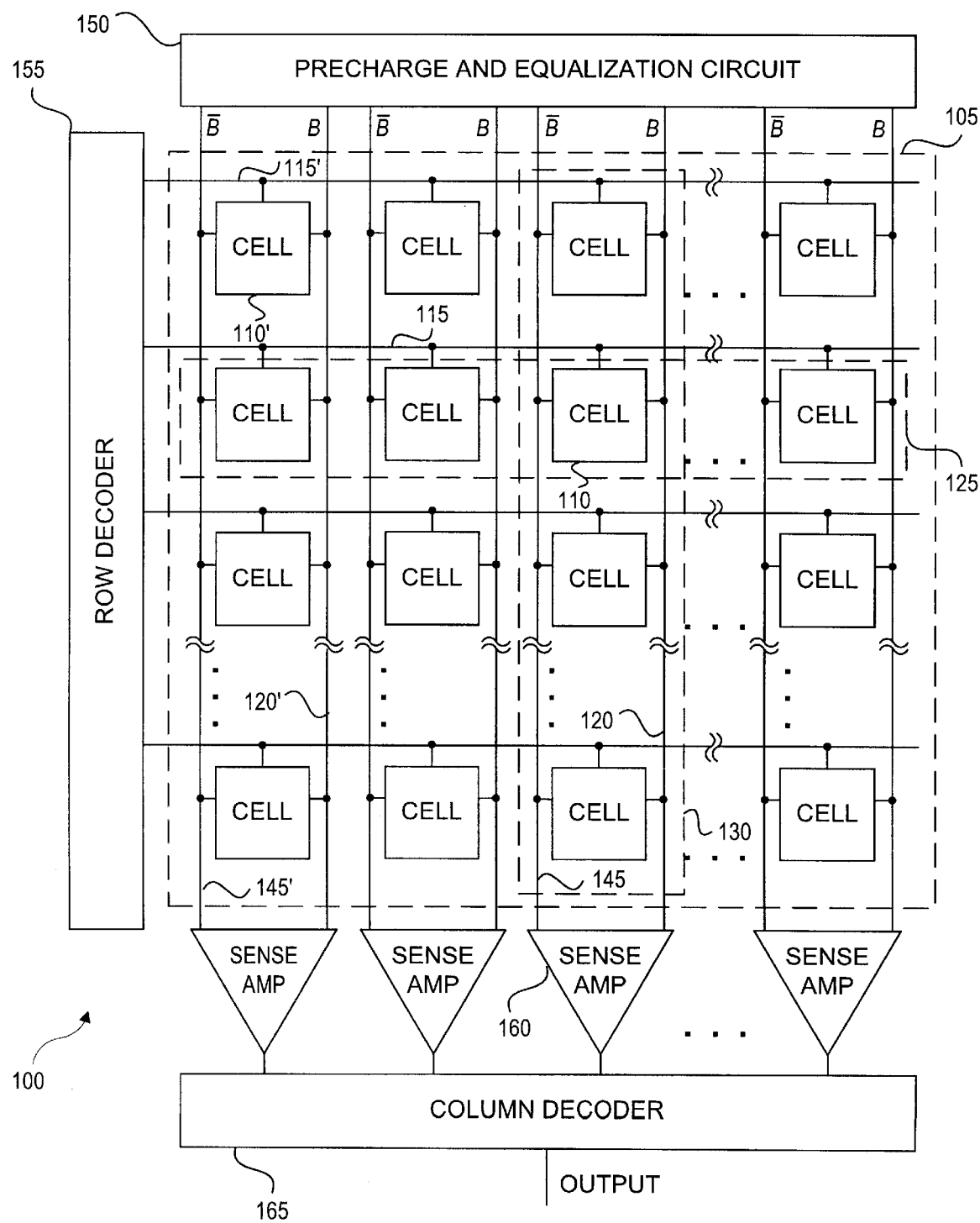
FIG. 1 is a block diagram of a prior art SRAM chip.
Figure 2:
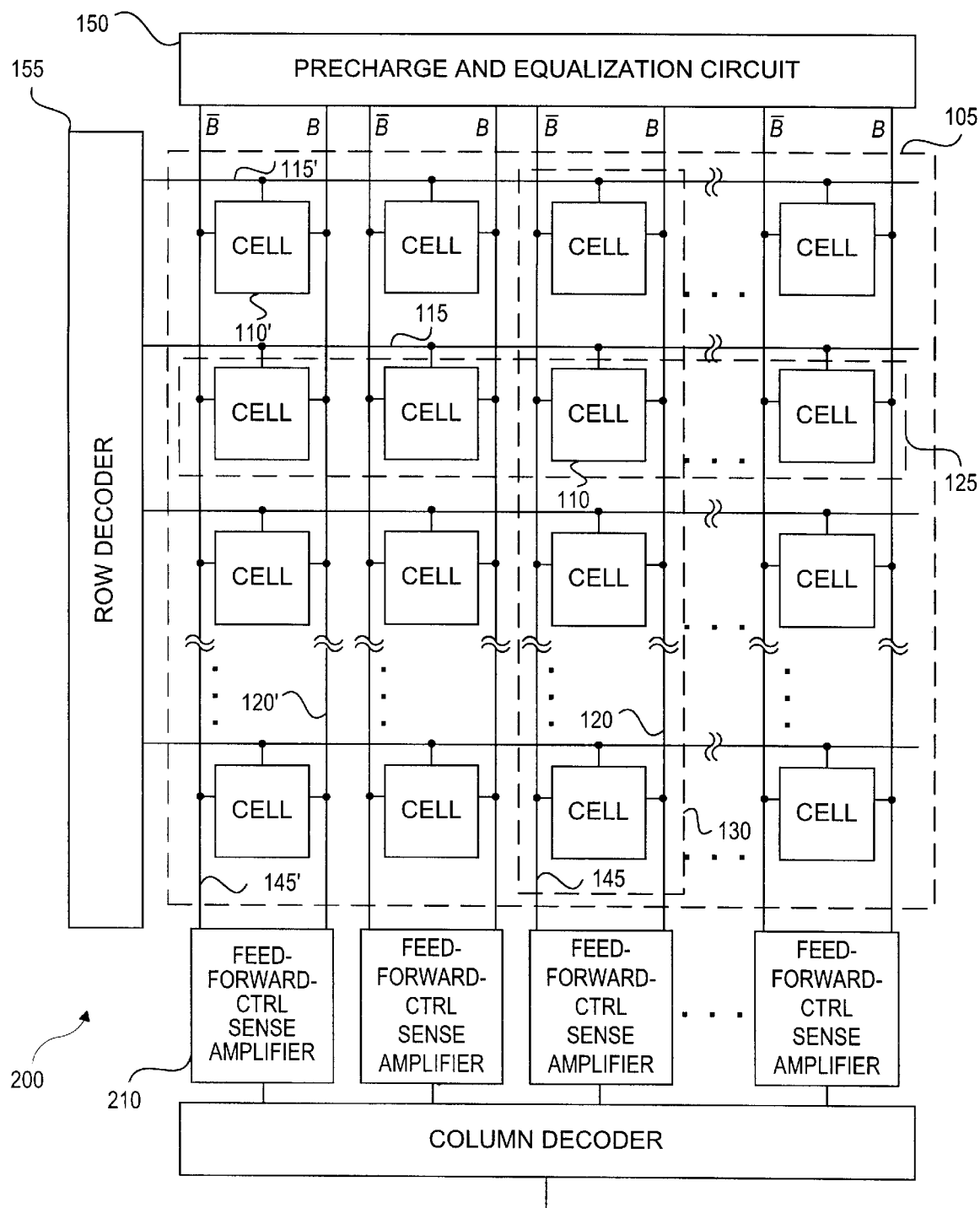
FIG. 2 is a block diagram showing the invention as part of a SRAM chip.

FIG. 2 shows a SRAM generally designated 200 incorporating the present invention. The subsystems of the SRAM 200 are identical to the SRAM 100, except that feedforward-controlled sense amplifiers 210 are used in place of the sense amplifiers 160. The feedforward-controlled sense amplifiers 210 advantageously produce the same output as the sense amplifier 160 while consuming less power.

Figure 3:
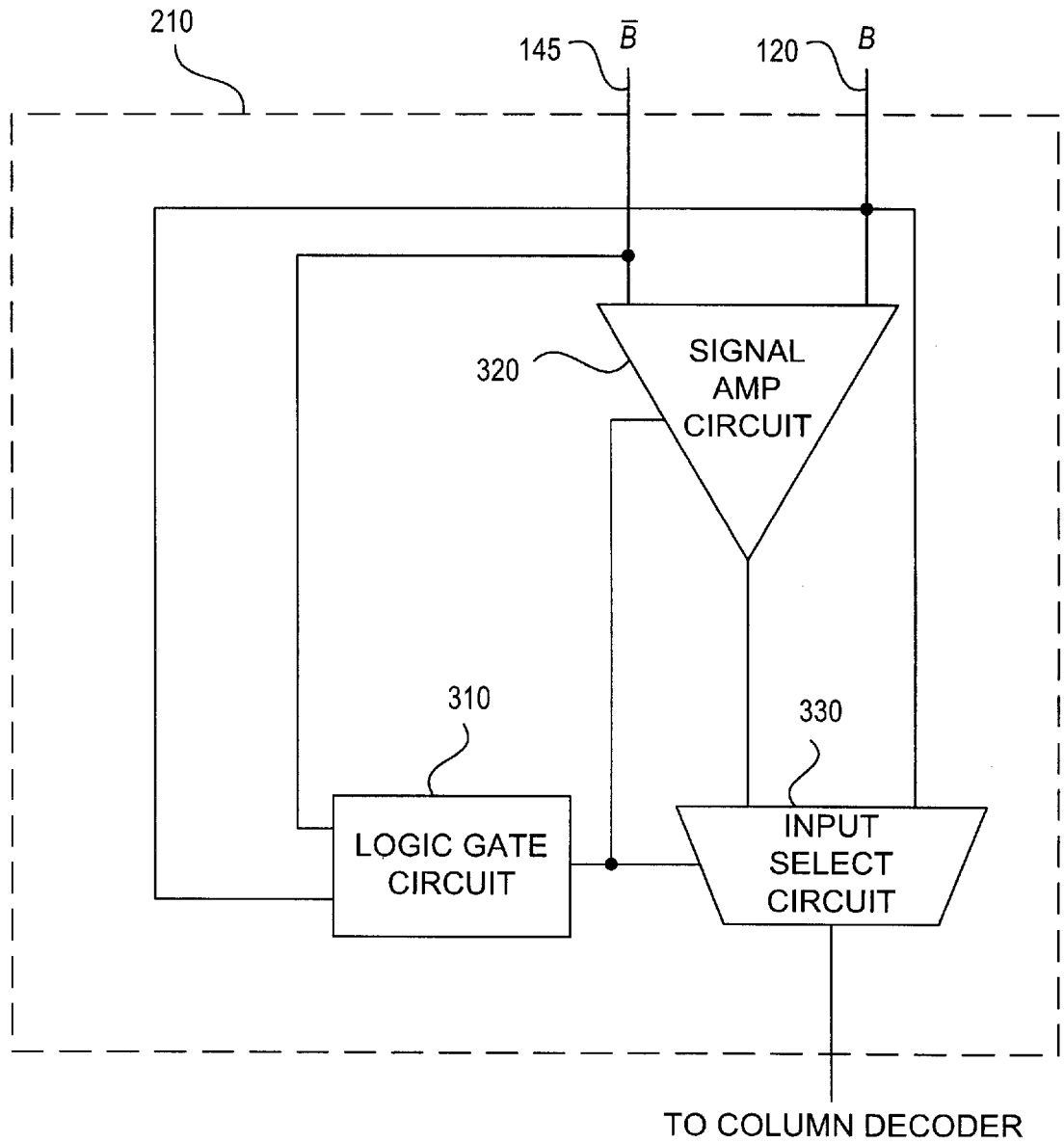
FIG. 3 is a block diagram of the invention.

FIG. 3 shows the subsystems of the feedforward-controlled sense amplifier 210. Bit lines B 120 and $\overline{\text{B}}$ 145 are connected to both a logic gate circuit 310 and a signal amplifying circuit 320. Bit line B 120 is further connected to an input select circuit 330. The output of the logic gate circuit 310 is coupled to the signal amplifying circuit 320 and to the input select circuit 330. The logic gate circuit 310 is operable to produce a first output that enables the signal amplifying circuit 320 and directs the input select circuit 330 to output an output from the signal amplifying circuit 320. A second output of the logic gate circuit 310 is operable to disable the signal amplifying circuit 320 and directs the input select circuit 330 to output the signal on bit line B 120.

The signal amplifying circuit 320 is disabled by the second output of the logic gate circuit 310 when $v_B$ and $v_{\overline{B}}$ reach levels that allow the signals on bit lines B 120 and $\overline{\text{B}}$ 145 to be resolved independently. The threshold voltage where the signals on bit lines B 120 and $\overline{\text{B}}$ 145 become distinctly positive or negative is approximately $$\frac{V_{DD} + V_{SS}}{2}.$$

Therefore, if bit lines B 120 and $\overline{\text{B}}$ 145 are precharged to HIGH, either signal must drop below approximately $$\frac{V_{DD} + V_{SS}}{2}$$

before the logic gate circuit 310 can resolve the signal. Until either $v_B$ or $v_{\overline{B}}$ drops below the threshold voltage, the logic gate circuit 310 interprets B 120 and $\overline{\text{B}}$ 145 as being in distinctly non-complementary states (two HIGH signals) and generates the first output.

In the case where the signal amplifying circuit 320 is active HIGH, the logic gate circuit 310 generates a HIGH first output as long as input signals B 120 and $\overline{\text{B}}$ 145 are in a distinctly non-complementary state. Once either $v_B$ or $v_{\overline{B}}$ pass the threshold voltage and becomes distinctly LOW, the logic gate circuit 310 generates a LOW second output.

It should be noted that if bit lines B 120 and $\overline{\text{B}}$ 145 are precharged to HIGH, neither would be LOW at the same time. Either bit line B 120 or $\overline{\text{B}}$ 145 will always remain in its HIGH state. Therefore, if the signal amplifying circuit 320 is active HIGH, the logic gate circuit 310 could be either an AND gate or an XNOR gate. If the signal amplifying circuit 320 is active LOW, the logic gate circuit 310 could be either a NAND or an XOR gate. The design of AND, XNOR, NAND, and XOR logic gates are well known in the art.

The input select circuit 330 can also be of conventional design. For example, either a conventional multiplexer or a pair of tri-state buffers provide the desired result, namely, selecting the output of the signal amplifying circuit 320 only when the signal amplifying circuit 320 is enabled and selecting bit line B 120 when the signal amplifying circuit 320 is disabled.

The combination of the logic gate circuit 310, signal amplifying circuit 320, and input select circuit 330 permits the feedforward-sense amplifier 210 to allow the direct output of bit line B 120 when amplification of the difference between bit lines B 120 and $\overline{\text{B}}$ 145 is unnecessary.

Figure 4:
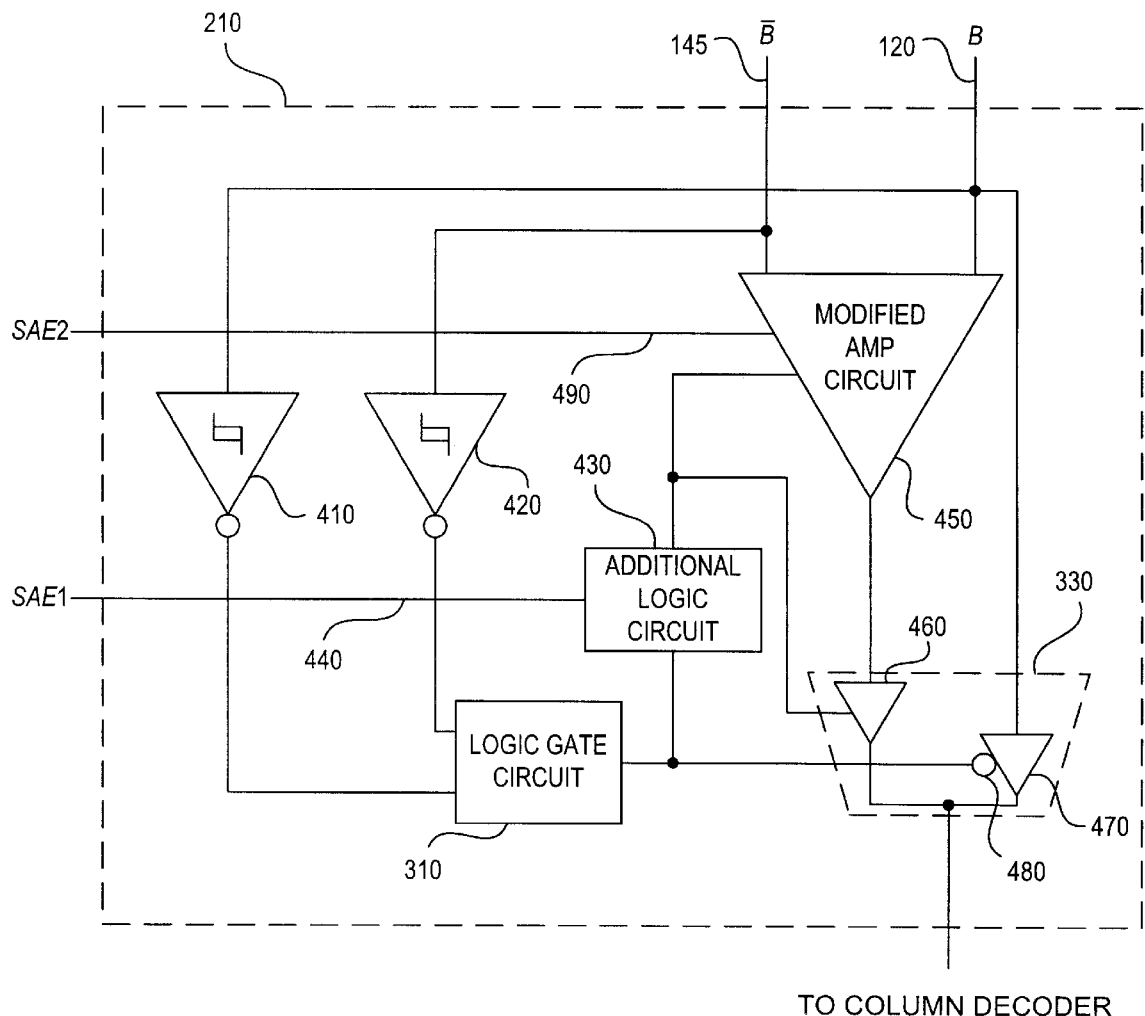
FIG. 4 is a block diagram of the invention using inverting Schmitt triggers, tri-state devices, a modified amplifying circuit, and an additional logic circuit.

FIG. 4 shows an alternative embodiment of the invention with a first inverting Schmitt trigger 410 connected to bit line B 120 and a second inverting Schmitt trigger 420 connected to bit line $\overline{\text{B}}$ 145. The output of an inverting Schmitt trigger is dependant on both its input voltage and whether the input voltage is rising or falling.

Figure 5:
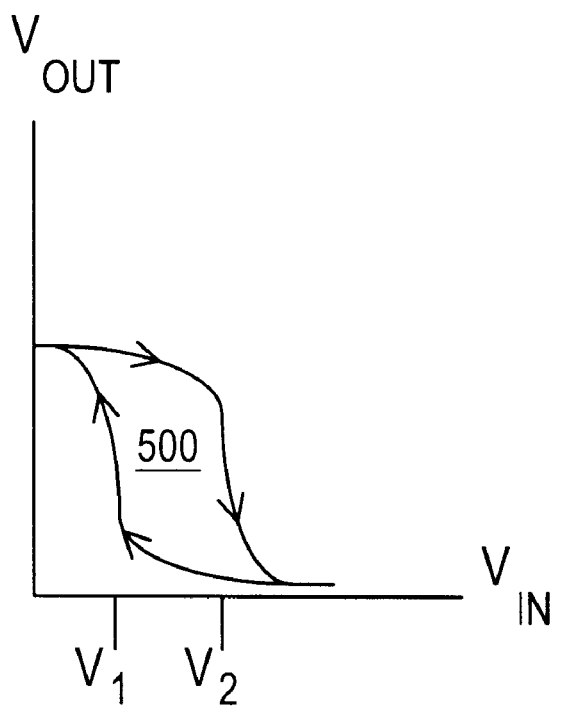
FIG. 5 is a chart of the hysteresis effect of the inverting Schmitt trigger.

FIG. 5 shows the characteristic hysteresis 500 for an inverting Schmitt trigger. If the input voltage is falling, a voltage $V_1$ is required before the device will begin to output a signal representing HIGH. If the input voltage is rising, a voltage $V_2$ is required before the device will begin to output a signal representing LOW. Since $V_2$ is greater than $V_1$, a hysteresis 500 is formed.

As previously mentioned, the threshold voltage where $v_B$ or $v_{\overline{B}}$ becomes distinctly positive or negative is approximately $$\frac{V_{DD} + V_{SS}}{2}.$$

More precisely, there is a range of voltages from $V_{thresholdLOW}$ to $V_{thresholdHIGH}$ where a system will not be able to predictably recognize an input as either LOW or HIGH (the indeterminate range). Therefore, a hysteresis where $V_1$ is less than or equal to $V_{thresholdLOW}$ and $V_2$ is greater than or equal to $V_{thresholdHIGH}$ is desirable in situations where $v_B$ or $v_{\overline{B}}$ would remain in the indeterminate range for a significant period of time.

With reference to FIG. 4, the feedforward-controlled sense amplifier 210 is shown including an additional logic circuit 430. The additional logic circuit 430 accepts both the output from the logic gate circuit 310 and an additional sense amplifier enable, SAE1 440, as inputs and outputs a signal to a signal amplifying circuit including a modified signal amplifying circuit 450. The structure of the additional logic gate 430 is dependent upon whether the modified signal amplifying circuit 450 is active LOW or active HIGH, the output of the logic gate circuit 310, and the signal SAE1 440.

The signal SAE1 440 may be derived from one or several control signals. For example, if the SRAM 200 does not read data during the LOW clock cycle, the additional logic circuit 430 can ensure that the modified signal amplifying circuit 450 is not enabled (and, thereby, conserves power) during the LOW clock cycle. If there are several possible SRAMs 200 available to the overall system, and a device enable signal is required, SAE1 440 may be derived from both the clock and the device enable such that the additional logic circuit 430 only allows the modified signal amplifying circuit 450 to be enabled when the SRAM 200 has been selected, the clock signal is in the appropriate phase and B 120 and $\overline{\text{B}}$ 145 are not in distinctly complementary states.

With continued reference to FIG. 4, power is further conserved by modifying the input select circuit 330 such that it is disabled when the feedforward-controlled sense amplifier 210 is not being used. One way to accomplish this is by using a pair of tri-state buffers 460 and 470 that are enabled by different inputs. The tri-state buffer 460 that controls the flow from the modified signal amplifying circuit 450 is only enabled when the modified signal amplifying circuit 450 itself is enabled. The tri-state buffer 470 that controls the output of bit line B 120 is only enabled when bit line B 120 and $\overline{\text{B}}$ 145 are in distinctly complementary states.

The embodiment shown in FIG. 4 assumes that both the tri-state buffer 460 and the modified signal amplifying circuit 450 are enabled in the same state. If they are not enabled in the same state, an additional inverter would be required. Similarly, the inverter 480 shown in FIG. 4 is only needed for the second tri-state buffer 470 if the output of the logic gate circuit 310 when bit lines B 120 and B̄ 145 are in distinctly complementary states is not in the correct state to enable the second tri-state buffer 470.

FIG. 4 also shows an optional second sense amplifier enable, SAE2 490. SAE2 490 is only used if a modified signal amplifying circuit 450 is used. The difference between a modified signal amplifying circuit 450 and a signal amplifying circuit 320 is the presence of an equalizer.

Figure 6:
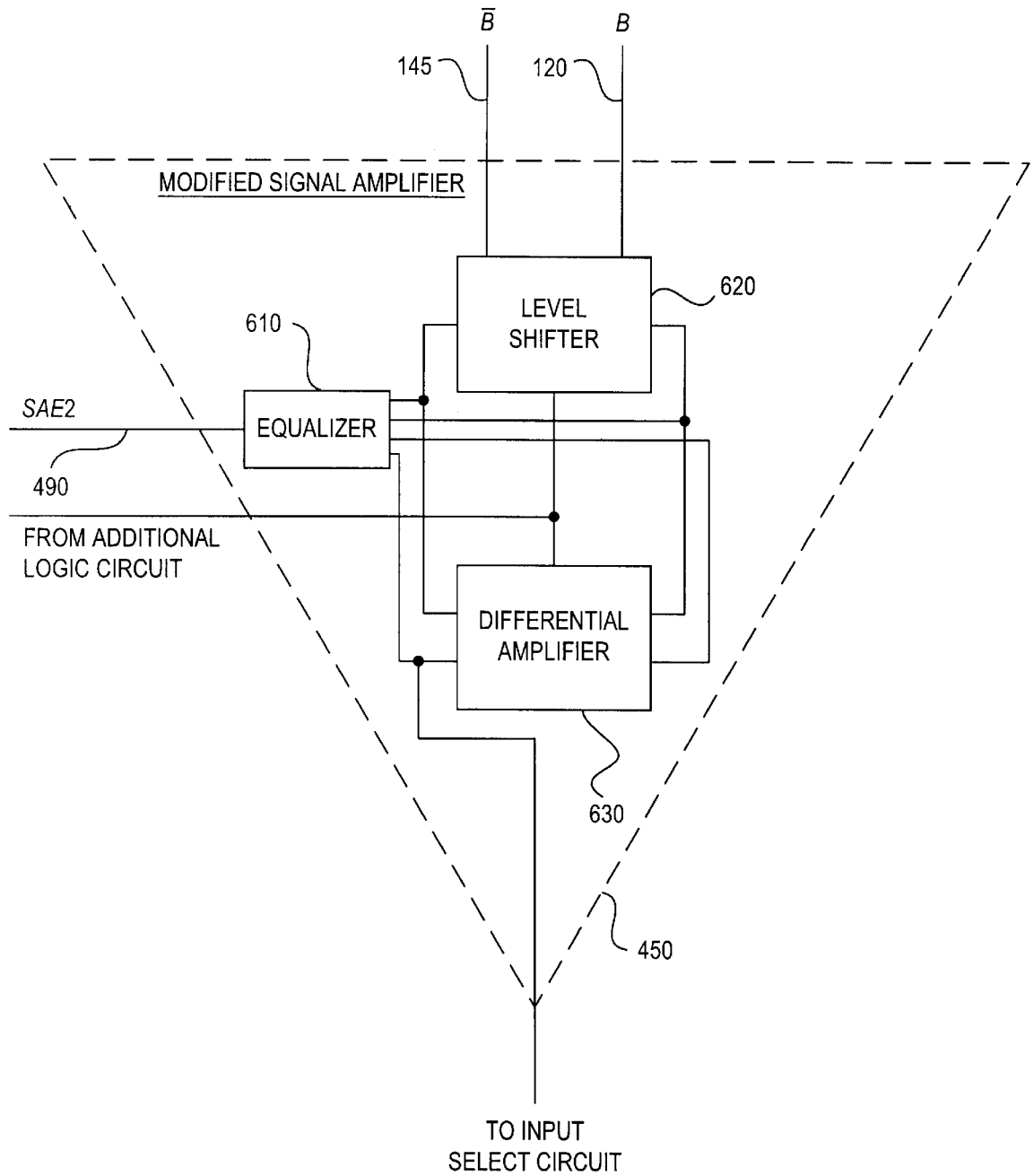
FIG. 6 is a block diagram of the equalizing circuit used in a preferred embodiment of the invention.

FIG. 6 shows the modified signal amplifying circuit 450 with an equalizer 610, a level shifter 620 and a differential amplifier 630. The output of the additional logic circuit 430 signal enables only the level shifter 620 and the differential amplifier 630 portions of the modified signal amplifying circuit 450 while the SAE2 490 signal enables the equalizer 610 portion of the modified signal amplifying circuit 450. Preferably, SAE2 490 will not enable the equalizer 610 until after SAE1 440 has enabled the level shifter 620 and the differential amplifier 630. The action of the modified signal amplifying circuit 450 is thereby delayed until bit lines B 120 and B̄ 145 have had a chance to start changing voltages.

Figure 7:
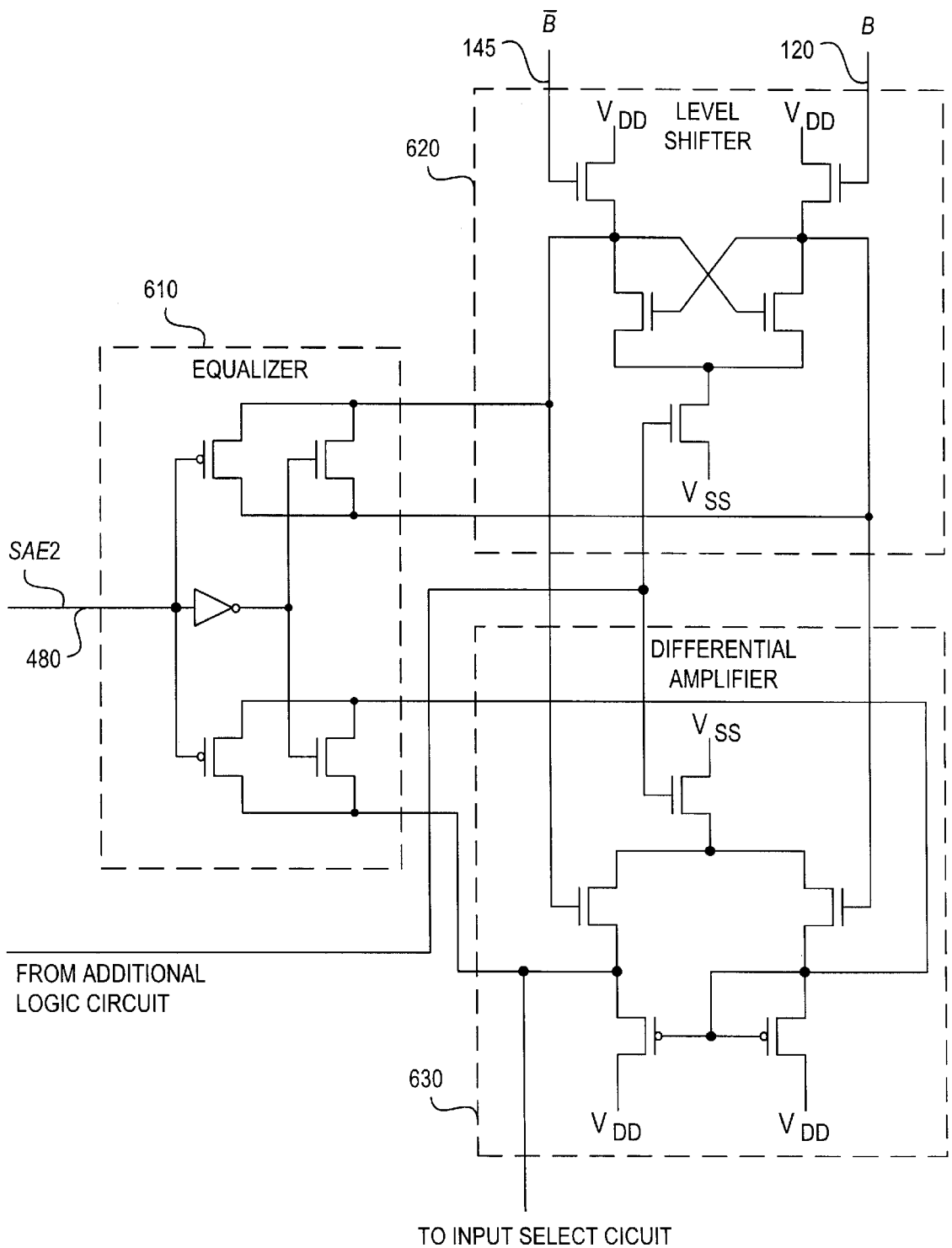
FIG. 7 is a circuit diagram of the modified signal amplifier used in a preferred embodiment of the invention.

FIG. 7 shows a detailed circuit diagram of each component of the modified signal amplifying circuit 450. Since each component is well known in the art, they will not be described here. Those skilled in the art will be able to optimize the circuit shown in FIG. 7 to suit their particular applications. For example, if symmetry is desired, well-known balancing techniques could be used to include additional inverters and use redundant transistors to achieve a highly symmetrical circuit.

Although the invention has been described in its presently contemplated best mode, it is clear that it is susceptible to numerous modifications, modes of operation and embodiments, all within the ability and skill of those familiar with the art and without the exercise of further inventive activity. Accordingly, that which is intended to be protected by Letters Patents is set forth in the claims and includes all variations and modifications that fall within the spirit and scope of the invention.

I claim:

1. A circuit for discriminating between complementary first and second input signals which may or may not be in distinctly complementary states and may be in indeterminate states, comprising:

a logic gate circuit having as inputs the first and second input signals and producing a first output when the first and second input signals are not in distinctly complementary states and a second output when the first and second input signals are in distinctly complementary states;

a signal amplifying circuit having as inputs the first and second input signals and the logic gate circuit output, the signal amplifying circuit being enabled by the first output and producing an output which varies depending upon whether the first input signal is greater than, equal to, or less than the second input signal, and being disabled by the second output; and an input select circuit having as inputs the signal amplifying circuit output and either the first or second input signal, the input select circuit producing an output dependant upon the signal amplifying circuit output when the signal amplifying circuit is enabled and an output dependant upon either the first or second input signal when the signal amplifying circuit is disabled.

2. The circuit of claim 1, further comprising a pair of Schmitt triggers coupled between the first and second input signals and the logic gate circuit, for ensuring that the logic gate circuit output does not change states while the first and second input signals are in indeterminate states.

3. The circuit of claim 2, further comprising an additional logic circuit coupled between the logic gate circuit and the signal amplifying circuit, the additional logic circuit being capable of interpreting control signals and disabling the signal amplifying circuit accordingly.

4. The circuit of claim 2, wherein the signal amplifying circuit further comprises an equalizer, a level shifter and a differential amplifier, the equalizer being capable of interpreting a control signal and disabling the level shifter and the differential amplifier accordingly.

5. The circuit of claim 3, wherein the input select circuit comprises a pair of tri-state buffers.

6. The circuit of claim 1, wherein the first and second input signals are respectively a signal from a bit line of a static random access memory, and a complement of the signal.

7. A circuit for discriminating between a first input signal from a bit line of a static random access memory, and a second input signal from a complement of the bit line, comprising:

first and second inverting Schmitt triggers capable of receiving a respective one of said input signals and producing respective trigger output signals;

a XNOR logic gate capable of receiving said trigger output signals as input signals and producing a XNOR output signal;

a differential sense amplifier capable of being enabled by said XNOR output signal to discriminate between the first and second input signals and produce an amplified output signal; and a tri-state logic input select circuit capable of being controlled by said XNOR output signal to select as an input thereto either said first input signal or said amplified output signal to produce a circuit output signal.

* * * * *